(12) United States Patent
Wang et al.

(10) Patent No.: US 7,395,035 B2
(45) Date of Patent: Jul. 1, 2008

(54) UP-CONVERSION MIXING SYSTEM WITH HIGH CARRIER SUPPRESSION

(75) Inventors: Yao-Chi Wang, Hsinchu (TW); Ying-Tang Chang, Sindian (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 315 days.

(21) Appl. No.: 11/407,954

(22) Filed: Apr. 21, 2006

(65) Prior Publication Data

US 2006/0269013 A1 Nov. 30, 2006

(30) Foreign Application Priority Data

Apr. 28, 2005 (TW) .............................. 94113577 A

(51) Int. Cl.
*H01Q 11/12* (2006.01)
(52) U.S. Cl. .................. 455/118; 455/91; 455/114.2; 375/295; 375/307
(58) Field of Classification Search ............... 455/91, 455/114.2, 114.3, 118; 375/295, 296, 307
See application file for complete search history.

(56) References Cited

U.S. PATENT DOCUMENTS 5,852,521 A * 12/1998 Umeyama et al. ............. 360/46

* cited by examiner

*Primary Examiner*—Edward Urban
*Assistant Examiner*—Raymond S. Dean
(74) *Attorney, Agent, or Firm*—Bacon & Thomas, PLLC

(57) ABSTRACT

An up-conversion mixing system with high carrier suppression, which includes first and second LPFs to filter a first and a second input signals to thereby produce a first and a second filtered signals respectively; a first amplifier to amplify the first input signal and the first filtered signal to thereby produce a first amplified signal; a second amplifier to amplify the second input signal and the second filtered signal to thereby produce a second amplified signal, wherein the second amplifier is cross-coupled with the first amplifier in order to couple the first and the second amplified signals, thereby reducing a DC offset of a differential voltage output by the first and the second differential output terminals; and a switch to receive a differential local oscillation signal to shift the first and the second amplified signals up to frequencies associated with the local oscillation signal.

13 Claims, 6 Drawing Sheets

UP-CONVERSION MIXING SYSTEM WITH HIGH CARRIER SUPPRESSION

BACKGROUND OF THE INVENTION

1. Field of the Invention

The invention relates to the technical field of mixer and, more particularly, to an up-conversion mixing system with high carrier suppression in a radio frequency (RF) transmitter.

2. Description of Related Art

FIG. 1 is a block diagram of a typical RF transmitter. As shown in FIG. 1, the transmitter includes a mixer 110, a power amplifier 120 and an antenna 130. The mixer 110 receives a baseband signal and a local oscillation signal LO in order to shift the baseband signal up to an RF band. Such a frequency conversion is referred to as a direct conversion, which has the features of high integration and low cost and thus is widely used by an RF transmitter.

However, when the status of mixer 110 is not fully differential, or the baseband signal contains a DC offset, a leakage is presented in the output terminal of the mixer 110. The leakage may interfere the spectrum of the RF signal because of the same frequency between the signal LO and the RF signal, then reduce the RF signal quality and affect the performance of the RF transmitter.

To overcome this problem, FIG. 2 is a schematic diagram of a conventional solution for the leakage of a mixer. As shown in FIG. 2, a voltage sampling and hold operation is performed on node 201, 202 to thus obtain DC voltages of the nodes 201, 202. Next, the subtractors 211, 212 subtracts the DC signals from received signals respectively. However, timing control for the sampling circuits increase the complexity and cost of the entire system. In addition, the leakage caused by a mismatch of the mixers 210 cannot be overcome. Therefore, it is desirable to provide an improved mixer to mitigate and/or obviate the aforementioned problems.

SUMMARY OF THE INVENTION

The object of the invention is to provide an up-conversion mixing system with high carrier suppression, which can avoid both the leakage caused by a DC offset of the baseband output terminal and reduce the complexity and cost of the entire system in the prior art.

In accordance with one aspect of the present invention, there is provided an up-conversion mixing system with high carrier suppression. The system includes first differential input terminal and second differential input terminal, a first low pass filter (LPF), a first amplifier, a second LPF, a second amplifier and a switch. The first differential input terminal and the second differential input terminal receive a first input signal and a second input signal respectively. The first LPF is connected to the first differential input terminal and filters the first input signal to thereby produce a first filtered signal. The first amplifier has a first positive input terminal connected to the first differential input terminal, a first negative input terminal connected to the first LPF, a first positive output terminal and a first negative output terminal, to thereby amplify the first input signal and the first filtered signal and output a first amplified signal at the first positive output terminal and the first negative output terminal. The second LPF is connected to the second differential input terminal and filters the second input signal to thereby produce a second filtered signal. The second amplifier has a second positive input terminal connected to the second differential input terminal, a second negative input terminal connected to the second LPF, a second positive output terminal and a second negative output terminal, to thereby amplify the second input signal and the second filtered signal and output a second amplified signal at the second positive and the second negative output terminals, wherein the second negative output terminal is connected to the first positive output terminal, and the first negative output terminal is connected to the second positive output terminal, such that the first amplified signal and the second amplified signal are cross-coupled at the first positive output terminal and the second positive output terminal. The switch is coupled to the first positive output terminal and the second positive output terminal and receives a differential local oscillation signal to thereby shift the first amplified signal and the second amplified signal up to frequencies associated with the local oscillation signal.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
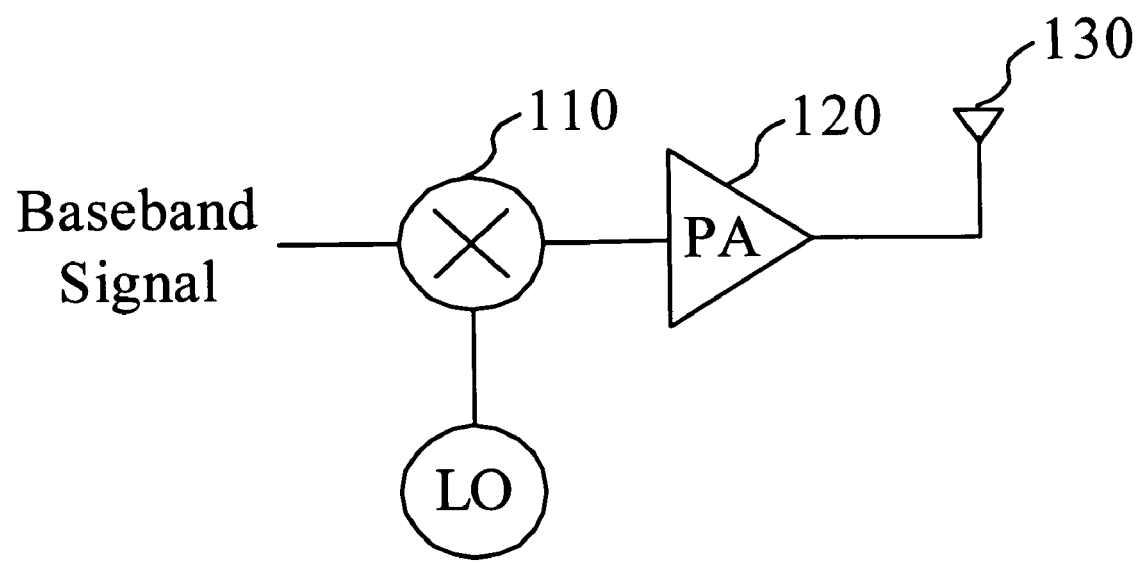
FIG. 1 is a block diagram of a typical RF transmitter.
Figure 2:
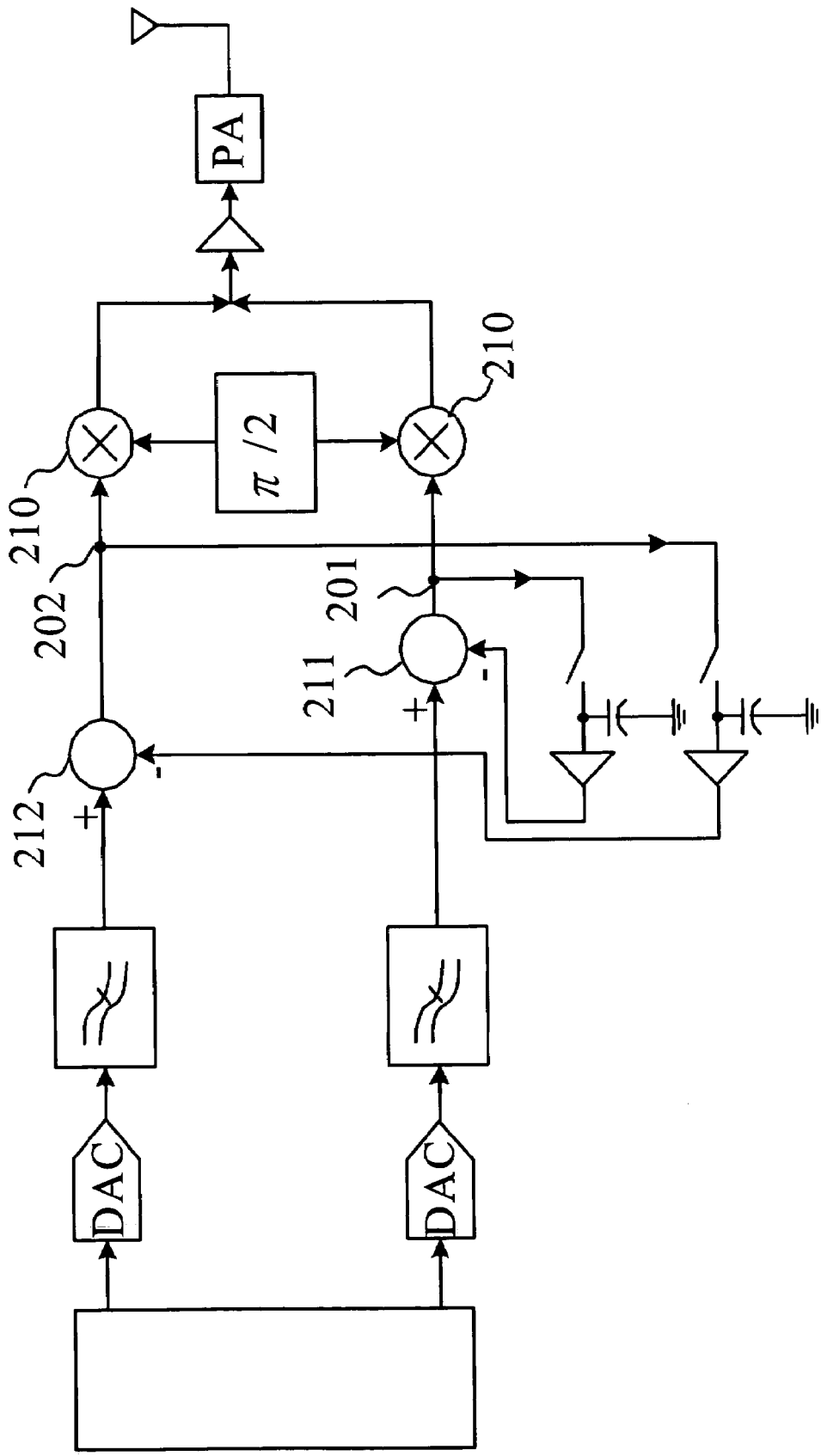
FIG. 2 is a schematic view of a typical solution for the leakage of a mixer.
Figure 3:
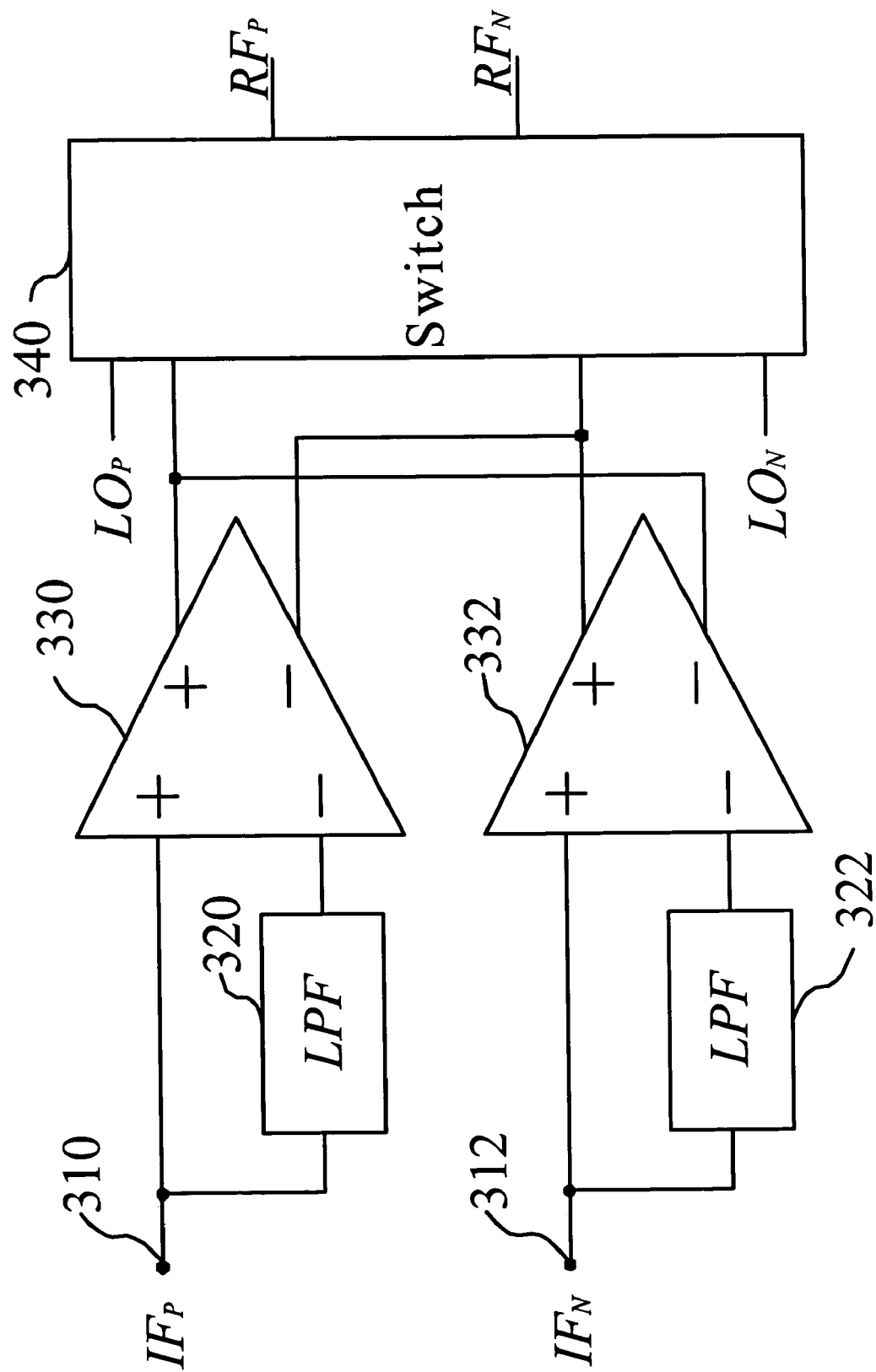
FIG. 3 is a block diagram of an up-conversion mixing system with high carrier suppression in accordance with the invention.

FIG. 3 is a block diagram of an up-conversion mixing system with high carrier suppression in accordance with the invention. In FIG. 3, the system includes a first differential input terminal 310, a second differential input terminal 312, a first low pass filter (LPF) 320, a first amplifier 330, a second LPF 322, a second amplifier 332 and a switch 340.

The first and the second differential input terminals 310, 312 receive a first input signal $IF_P$ and a second input signal $IF_N$ respectively. The first input signal $IF_P$ and the second input signal $IF_N$ are analog signals with DC offset respectively, which are a pair of differential input signals. The first LPF 320 is connected to the first differential input terminal 310 and filters the first input signal $IF_P$ to thereby produce a first filtered signal.

The first amplifier 330 has a first positive input terminal connected to the first differential input terminal 310, and a first negative input terminal connected to the first LPF 320, to thereby amplify the first input signal $I_P$ and the first filtered signal and output a first amplified signal at a first positive and a negative output terminals.

The second LPF 322 is connected to the second differential input terminal 312 and filters the second input signal to thereby produce a second filtered signal. The second amplifier 332 has a second positive input terminal connected to the second differential input terminal 312, and a second negative input terminal connected to the second LPF 322, to thereby amplify the second input signal $IF_N$ and the second filtered signal and output a second amplified signal at a second positive and a negative output terminals, wherein the second negative output terminal is connected to the first positive output terminal, and the first negative output terminal is connected to the second positive output terminal, such that the first and the second amplified signals are cross-coupled at the first and the second positive output terminals.

The switch 340 is coupled to the first positive output terminal and the second positive output terminal and receives a differential local oscillation signal ($LO_P$, $LO_N$) to thereby shift the first amplified signal and the second amplified signal up to associated frequencies with the local oscillation signal. In the RF transmitter, the differential local oscillation signal ($LO_P$, $LO_N$) has a frequency of 2.4 GHz.

Figure 4:
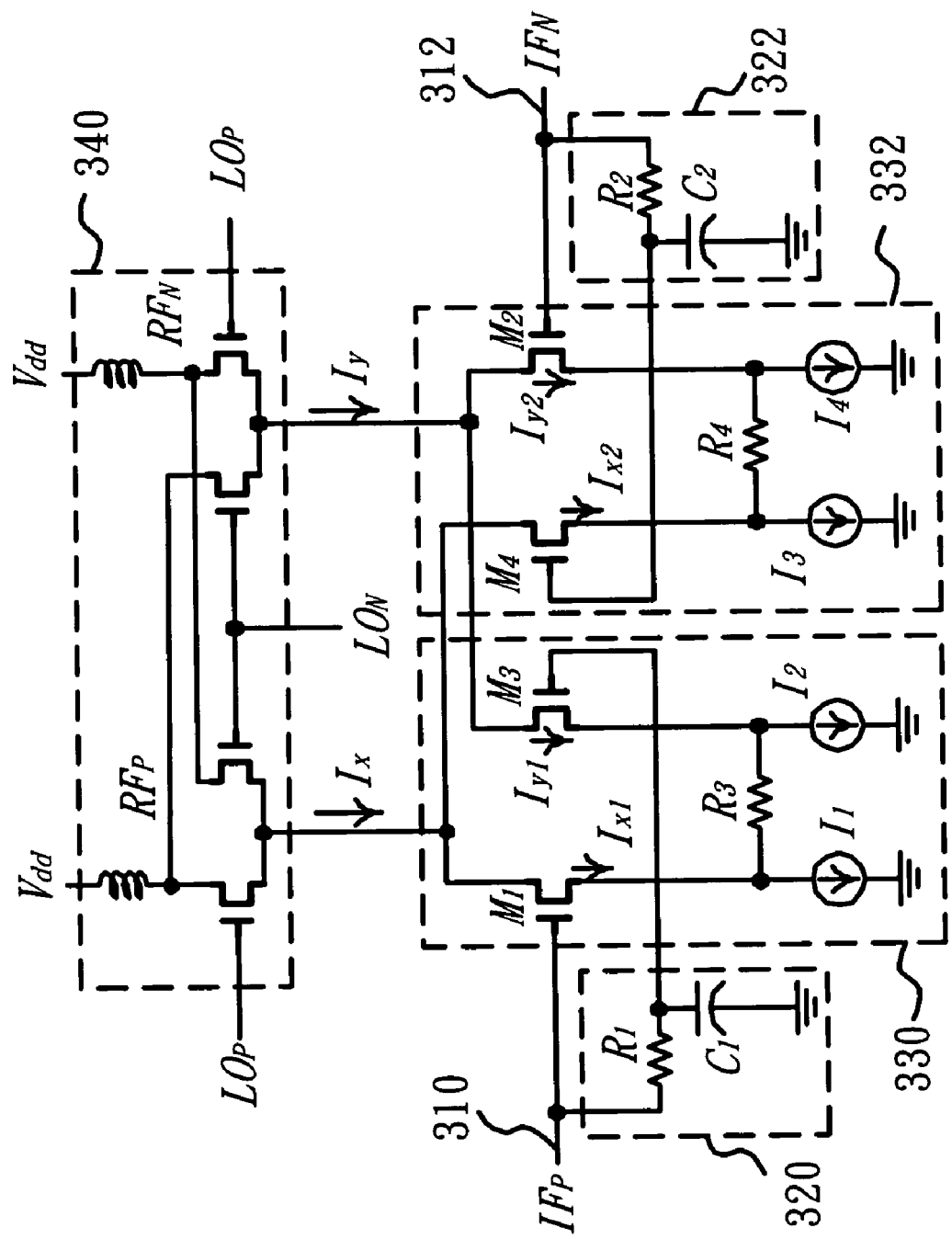
FIG. 4 a circuit of the up-conversion mixing system of FIG. 3 in accordance with the invention.

FIG. 4 a circuit of the up-conversion mixing system of FIG. 3 in accordance with the invention. As shown in FIG. 4, the first LPF 320 has a first resistor $R_1$ and a first capacitor $C_1$. The second LPF 322 has a second resistor $R_2$ and a second capacitor $C_2$. The first resistor $R_1$ and the second resistor $R_2$ can be a switch resistor bank. The first capacitor $C_1$ and the second capacitor $C_2$ can be a switch capacitor bank.

The first amplifier 330 has a first transistor $M_1$, a third transistor $M_3$, a third resistor $R_3$, a first current source $I_1$ and a second current source $I_2$. The second amplifier 332 has a second transistor $M_2$, a fourth transistor $M_4$, a fourth resistor $R_4$, a third current source $I_3$ and a fourth current source $I_4$. The first and the fourth resistors $R_3$ and $R_4$ can be a switch resistor bank.

The first resistor $R_1$ has one terminal connected to the first differential input terminal 310 and a gate of the first transistor $M_1$, and the other terminal connected to a gate of the third transistor $M_3$ and one terminal of the first capacitor $C_1$. The other terminal of the first capacitor $C_1$ is connected to a ground node. The second resistor $R_2$ has one terminal connected to the second differential input terminal 312 and a gate of the second transistor $M_2$, and the other terminal connected to a gate of the fourth transistor $M_4$ and one terminal of the second capacitor $C_2$. The other terminal of the second capacitor $C_2$ is connected to the ground node.

The first transistor $M_1$ has a drain connected to a drain of the fourth transistor $M_4$, and a source connected to one terminal of the third resistor $R_3$ and one terminal of the first current source $I_1$. The other terminal of the first current source $I_1$ is connected to the ground node. The other terminal of the third resistor $R_3$ is connected to a source of the third transistor $M_3$. The other terminal of the second current source $I_2$ is connected to the ground node. A drain of the third transistor $M_3$ is connected to a drain of the second transistor $M_2$.

The gate of the first transistor $M_1$ is the positive input terminal of the first amplifier 330, and the drain of the first transistor $M_1$ is the first positive output terminal of the first amplifier 330. The gate of the third transistor $M_3$ is the negative input terminal of the first amplifier 330, and the drain of the third transistor $M_3$ is the first negative output terminal of the first amplifier 330.

The second transistor $M_2$ has a source connected to one terminal of the fourth resistor $R_4$ and one terminal of the fourth current source $I_4$. The other terminal of the fourth current source $I_4$ is connected to the ground node. The other terminal of the fourth resistor $R_4$ is connected to one terminal of the third current source I3 and a source of the second transistor $M_4$. The other terminal of the third current source I3 is connected to the ground node.

The gate of the second transistor $M_2$ is the positive input terminal of the second amplifier 332, and the drain of the second transistor $M_2$ is the first positive output terminal of the second amplifier 332. The gate of the fourth transistor $M_4$ is the negative input terminal of the second amplifier 332, and the drain of the fourth transistor $M_4$ is the second negative output terminal of the second amplifier 332.

The first LPF 320 and the second LPF 322 block frequencies outside a small band about DC. Accordingly, the first LPF 320 outputs the DC component $V_{IF_P}$ (DC) of the first input signal $IF_P$, and the second LPF 322 outputs the DC component $V_{IF_N}$ (DC) of the second input signal $IF_N$.

Referring to FIG. 4, a current $I_x$ passing through the first positive output terminal and a current $I_y$ passing through the second positive output terminal are respectively represented as follows:

$$I_x = I_{x1} + I_{x2} = [V_{IF_P}(AC) + V_{IF_P}(DC)]/R_3 + V_{IF_N}(DC)/R_4,$$

$$I_y = I_{y1} + I_{y2} = [V_{IF_N}(AC) + V_{IF_N}(DC)]/R_4 + V_{IF_P}(DC)/R_3,$$

where $V_{IF_P}(AC)$ is an AC component of the first input signal $IF_P$, $V_{IF_P}(DC)$ is a DC component of the first input signal $IF_P$, $V_{IF_N}(AC)$ is an AC component of the second input signal $IF_N$, and $V_{IF_N}(DC)$ is a DC component of the second input signal $IF_N$. When $R_3 = R_4 = R$, a differential current ($I_x - I_y$) between the first and second positive output terminals is represented as follows:

$$\begin{aligned}I_x - I_y &= [V_{IF_P}(AC) + V_{IF_P}(DC)]/R_3 + V_{IF_N}(DC)/R_4 - \\ &\quad [V_{IF_N}(AC) + V_{IF_N}(DC)]/R_4 - V_{IF_P}(DC)/R_3 \\ &= [V_{IF_P}(AC) - V_{IF_N}(AC)]/R.\end{aligned} \quad (1)$$

As shown in equation (1), the differential current input to the switch 340 is associated only with the AC components of the first input signal and the second input signal. At this point, no matter what the DC component of a differential voltage between the input terminals is, the DC components can be eliminated effectively.

Figure 5:
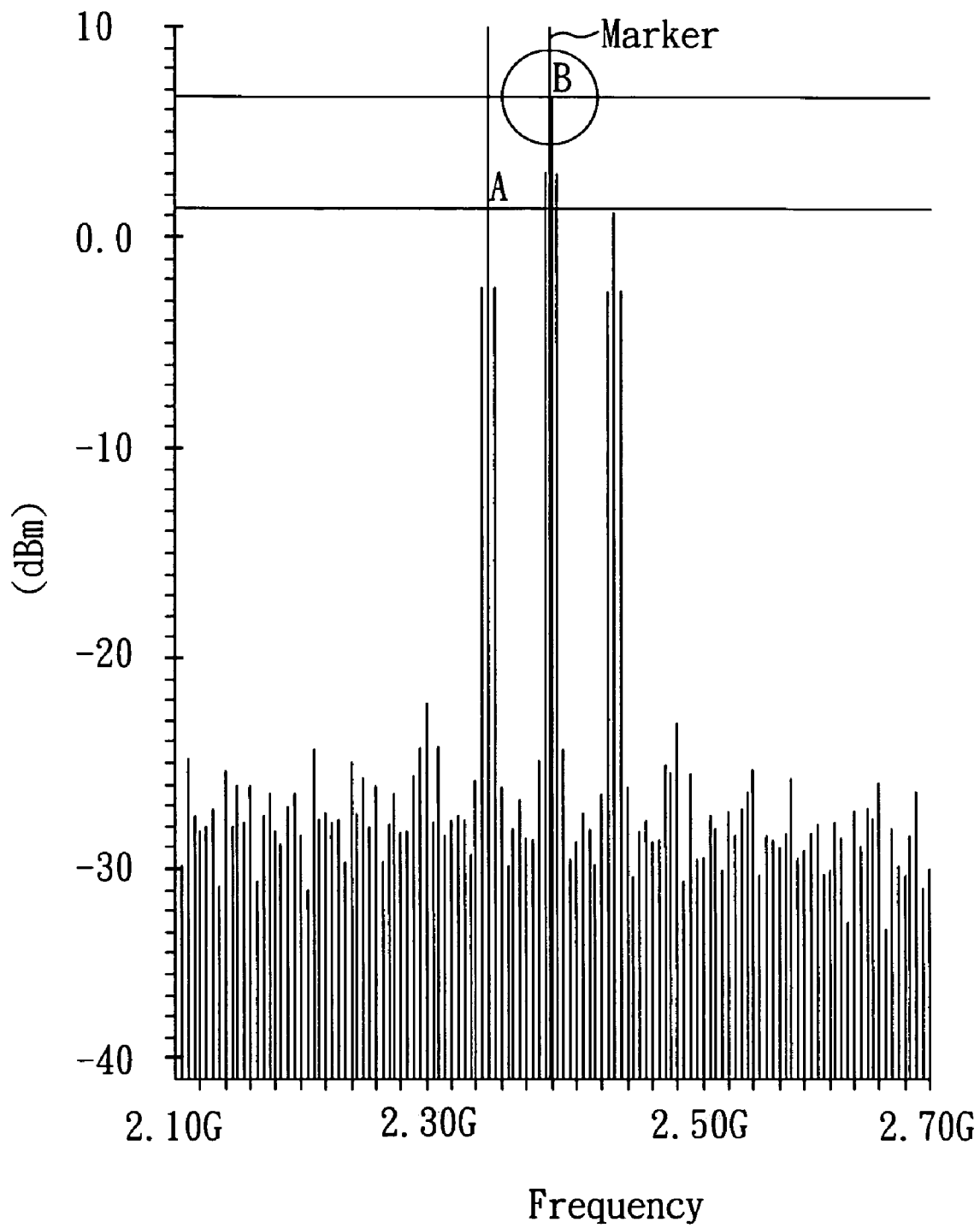
FIG. 5 is a schematic view of a spectrum simulation of an RF signal used in a typical mixing system operated at 2.4 GHz.
Figure 6:
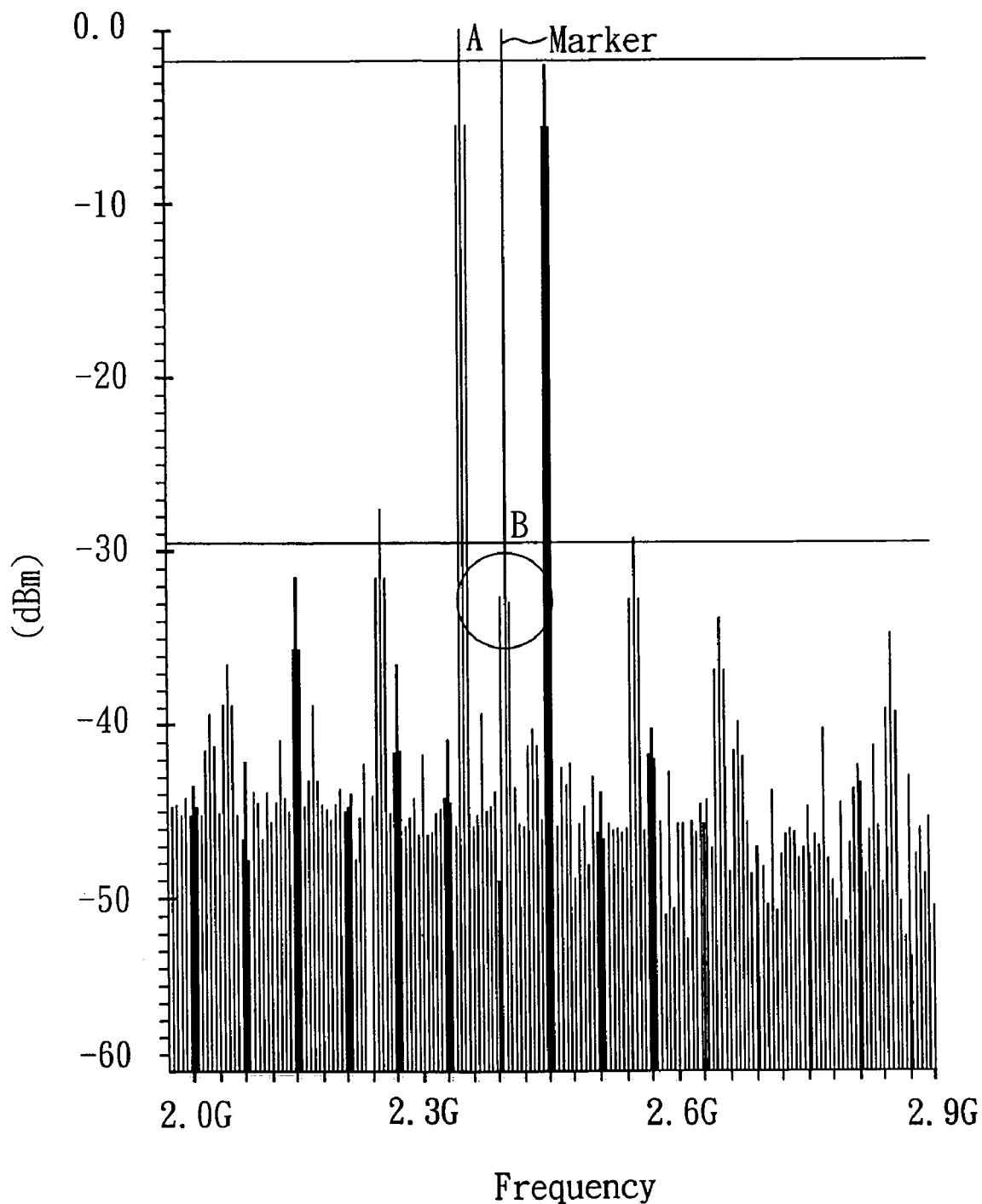
FIG. 6 is a schematic view of a spectrum simulation of an RF signal used in an inventive up-conversion mixing system operated at 2.4 GHz.

FIG. 5 is a schematic view of a spectrum simulation of an RF signal used in a typical mixing system operated at 2.4 GHz. FIG. 6 is a schematic view of a spectrum simulation of an RF signal used in an inventive up-conversion mixing system operated at 2.4 GHz. In contrast FIG. 5 with FIG. 6 at a same frequency of 2.4 GHz (point B), FIG. 5 obviously presents a leakage with an intensity of about +5.3 dBm, but FIG. 6 presents a leakage with an intensity of about −27.8 dBm only.

As cited, the prior art has the leakage caused by the different DC offsets of the positive and negative terminals of the mixer, and easily has a poor influence on the RF spectrum and signal quality. By comparison, the present invention uses the first and second LPFs 320 and 322 respectively to reduce the DC offsets of the differential input terminals in order to eliminate the leakage caused by the DC offsets of the baseband output terminals, so as to avoid increasing the entire system complexity and reduce the system cost.

Although the present invention has been explained in relation to its preferred embodiment, it is to be understood that many other possible modifications and variations can be made without departing from the spirit and scope of the invention as hereinafter claimed.

What is claimed is:

1. An up-conversion mixing system with high carrier suppression, comprising:

a first differential input terminal and second differential input terminal, which receive a first input signal and a second input signal respectively;

a first low pass filter (LPF), which is connected to the first differential input terminal and filters the first input signal to thereby produce a first filtered signal;

a first amplifier, which has a first positive input terminal connected to the first differential input terminal, a first negative input terminal connected to the first LPF, a first positive output terminal and a first negative output terminal, to thereby amplify the first input signal and the first filtered signal and output a first amplified signal at the first positive and the first negative output terminals;

a second low pass filter (LPF), which is connected to the second differential input terminal and filters the second input signal to thereby produce a second filtered signal;

a second amplifier, which has a second positive input terminal connected to the second differential input terminal, a second negative input terminal connected to the second LPF, a second positive output terminal and a second negative output terminal, to thereby amplify the second input signal and the second filtered signal and output a second amplified signal at the second positive and the second negative output terminals, wherein the second negative output terminal is connected to the first positive output terminal, and the first negative output terminal is connected to the second positive output terminal, such that the first amplified signal and the second amplified signal are cross-coupled at the first positive output terminal and the second positive output terminal; and a switch, which is coupled to the first positive output terminal and the second positive output terminal and receives a differential local oscillation signal to thereby shift the first amplified signal and the second amplified signal up to frequencies associated with the local oscillation signal.

2. The system as claimed in claim 1, wherein the first and the second low pass filters block frequencies outside a small band about DC.

3. The system as claimed in claim 1, wherein the first LPF comprises a first resistor and a first capacitor.

4. The system as claimed in claim 3, wherein the first resistor has one terminal connected to the first differential input terminal and the other terminal connected to the first amplifier and one terminal of the first capacitor, and the first capacitor has the other terminal connected to a ground node.

5. The system as claimed in claim 4, wherein the first resistor is a switch resistor bank.

6. The system as claimed in claim 4, wherein the first capacitor is a switch capacitor bank.

7. The system as claimed in claim 1, wherein the second LPF comprises a second resistor and a second capacitor.

8. The system as claimed in claim 7, wherein the second resistor has one terminal connected to the second differential input terminal and the other terminal connected to the second amplifier and one terminal of the second capacitor, and the second capacitor has the other terminal connected to the ground node.

9. The system as claimed in claim 8, wherein the second resistor is a switch resistor bank.

10. The system as claimed in claim 8, wherein the second capacitor is a switch capacitor bank.

11. The system as claimed in claim 1, wherein the first amplifier and the second amplifier are matched to each other.

12. The system as claimed in claim 1, wherein the first amplifier and the second amplifier have a same gain feature.

13. The system as claimed in claim 1, wherein the local oscillation signal has a frequency of 2.4 GHz.

* * * * *